United States Patent [19]

Hattori et al.

[11] Patent Number: 5,229,811
[45] Date of Patent: Jul. 20, 1993

[54] APPARATUS FOR EXPOSING PERIPHERAL PORTION OF SUBSTRATE

[75] Inventors: Ken Hattori; Kesayoshi Amano, both of Tokyo; Masao Nakajima, Kawasaki; Masayoshi Naito, Sendai, all of Japan

[73] Assignee: Nikon Corporation, Tokyo, Japan

[21] Appl. No.: 922,660

[22] Filed: Jul. 31, 1992

Related U.S. Application Data

[63] Continuation of Ser. No. 837,107, Feb. 18, 1992, abandoned, which is a continuation of Ser. No. 712,539, Jun. 10, 1991, abandoned.

[30] Foreign Application Priority Data

Jun. 15, 1990 [JP] Japan ................... 2-156686

[51] Int. Cl.[5] ................ G03B 27/42; G03B 27/48; G03B 27/50
[52] U.S. Cl. .......................... 355/50; 355/53; 355/68
[58] Field of Search ............... 355/50, 53, 68, 77

[56] References Cited

U.S. PATENT DOCUMENTS

| 4,899,195 | 2/1990 | Gotoh | 355/53 X |
| 4,910,549 | 3/1990 | Sugita | 355/53 |
| 5,028,955 | 7/1991 | Hayashida et al. | 355/53 |
| 5,061,956 | 10/1991 | Takubo et al. | 355/55 |

FOREIGN PATENT DOCUMENTS 0325930 8/1989 European Pat. Off. .

2-56924 2/1990 Japan .

OTHER PUBLICATIONS

Patent Abstracts of Japan, vol. 7, No. 256 (P-236) (1401) Nov. 15, 1983.

Primary Examiner—Richard A. Wintercorn
Attorney, Agent, or Firm—Shapiro and Shapiro

[57] ABSTRACT

An exposing apparatus for exposing the periphery portion of a substrate on which resist is uniformly applied while rotating the substrate by a rotating device around a substantially central portion of the substrate, comprising: an irradiating device capable of irradiating a light beam, which is not sensed by the resist, toward the periphery portion of the resist; a light receiving device disposed to confront the irradiating device, receiving the light beam and outputting a light receipt signal in accordance with the quantity of received light; a detection device for detecting the rotational angle of the resist and outputting an angular signal; a moving device for relatively moving the light beam irradiated and the substrate in a radial direction; and a control device, wherein the substrate is disposed between the irradiating device and the light receiving device so as to shield a portion of the light beam and a control device controls the moving device in accordance with the light receipt signal and the angular signal so as to relatively move the light beam and the substrate in such a manner that the radial directional width of a region which is irradiated with the light beam is substantially constant in the periphery portion of the resist.

6 Claims, 7 Drawing Sheets

APPARATUS FOR EXPOSING PERIPHERAL PORTION OF SUBSTRATE

This is a continuation of application Ser. No. 837,107 filed Feb. 18, 1992; which is a continuation of application Ser. No. 712,539 filed Jun. 10, 1991, both of which are now abandoned.

BACKGROUND OF THE INVENTION

1. Field of the Invention

The present invention relates to an apparatus for selectively exposing the peripheral portion of a circular substrate such as semiconductor wafer for use to manufacture a semiconductor element.

2. Related Background Art

A problem has been experienced with a photoresist, which is applied to a circular substrate such as a wafer having a cut portion (an orientation flat or notch) Of a predetermined shape, in that it can easily be separated at the peripheral portion of the wafer and the separated photoresist adheres to the surface of the wafer as a foreign matter, causing an undesirable influence to be exerted upon the lithographic process included in the process of manufacturing a semiconductor. The separation of the photoresist can be effectively prevented by exposing it so as to harden it. Accordingly, an exclusive exposing apparatus has been used in which the wafer is rotated while irradiating the peripheral portion of the wafer with exposing light so that a predetermined exposure width (about 1 to 7 mm) of the peripheral portion of the wafer is selectively exposed. A specific structure has been disclosed in, for example, Japanese Patent Laid-Open No. 2-56924 (related to U.S. patent application Ser. No. 396,557 filed on Aug. 21, 1989). According to this disclosure, the structure comprises a light emitting portion (for example, an optical fiber) disposed extremely adjacently to the peripheral portion and capable of emitting exposing light, to which the resist is satisfactorily sensitive to the resist, and a light receiving portion disposed to confront the light emitting portion while holding the peripheral portion of the wafer, wherein the light emitting portion and the light receiving portion are integrally formed in such a manner that the integrated unit can be relatively moved in the radial direction of the wafer. When the peripheral portion is exposed to light, a portion, which corresponds to the predetermined exposure width (the radial directional length of the wafer), of the exposing light beams emitted from the light emitting portion is shielded by the wafer. The light beams which have not been shielded by the wafer are received by the light receiving portion. A signal obtained from the light receiving portion is used in the servo operation for maintaining the exposure width of the wafer at a predetermined value. That is, in accordance with the change in the level of the signals supplied from the light receiving portion, the light emitting portion, the light receiving portion and the wafer are respectively relatively moved in the radial direction of the rotation of the wafer so that a control is performed in such a manner that the peripheral portion is always exposed to light for a predetermined exposure width.

However, the above-described conventional technology is arranged in such a manner that the signal obtained from the light receiving portion is used to perform the servo operation. Therefore, when the intensity of the exposing light is excessively lowered due to the deterioration in the light source or when the light source is interchanged, the quantity of the light received by the light receiving portion can be considerably changed from a desired quantity with respect to the same exposure width. Therefore, the establishment of the correspondence from the aiming value for the servo operation cannot be made clearly. Therefore, a problem arises in that the exposure width at the time of the periphery exposure cannot be stabilized. Furthermore, if the intensity of the exposing light beam in the radial direction is not distributed uniformly, the relationship of the level of the signal in the light receiving portion with respect to the set exposure width cannot be made to be in the linear form. Therefore, it has been difficult to control the exposure width only by the light receipt signal obtained at the time of exposing the peripheral portion of the wafer. In addition, the servo conditions for the orientation flat (hereinafter called an "OF") is more strict than the circumferential portion. Therefore, the exposure width in this portion cannot be made uniform.

The above-described problems can be overcome by:

(1) An optical system for making uniform the intensity distribution of the exposing light beam is provided in the exposing light irradiating system.

(2) The levels of the light receipt signals which correspond to the set exposure width are respectively stored in a memory table.

However, in the case of (1), an excessively large optical system must be provided so as to make sufficiently uniform the intensity distribution. In the case of (2), a table of an excessively large memory capacity must be provided if the step, in which the exposure width in the periphery portion can be set, is desired to be finely sectioned. Furthermore, the table must be made again whenever the intensity distribution of the exposing light beam has been changed. If the signal value is obtained by using an approximate expression, the error of the approximate expression adversely effects the accuracy of the exposure width.

SUMMARY OF THE INVENTION

An object of the present invention is to provide an apparatus for exposing the periphery portion of a substrate which is not effected by the change in the intensity of exposing light beams or the non-uniform intensity distribution of the same and which is capable of exposing the periphery portion including the cut portion by a substantially uniform width.

In order to achieve the above-described object, according to one aspect of the present invention, there is provided an exposing apparatus for exposing the periphery portion of a wafer on which resist is uniformly applied while rotating the wafer around a substantially central portion of the wafer, the exposing apparatus comprising: irradiating means capable of selectively irradiating, via the same optical element, a first light beam (exposing light beam) which is sensed by the resist, and a second light beam (non-exposing light beam), which is not sensed by the resist, toward the periphery portion of the resist; light receiving means disposed to confront the light beam emitting portion of the irradiating means while holding the periphery portion of the wafer; moving means for relatively moving the light beam irradiated from the irradiating means and the wafer in a radial direction of the rotation; first control means which controls the operation of the moving means in accordance with the signal output from the light receiving means for the purpose of causing the irradiating means to emit the second light beam when the wafer is being rotated so as to make the periphery portion of the wafer to be irradiated with the second light beam a predetermined width L; a memorizing means for detecting information about the change in the relative position of movement of the moving means during the rotation of the wafer at least one time when the first control means is being operated and memorizing it while making it correspond to the rotational angular position of the wafer; and a second control means for causing the irradiating means to emit the first light beam during the rotation of the wafer and controlling the operation of the moving means in accordance with the information memorized by the memorizing means.

According to the present invention, the second light beam, which is not sufficiently sensed by the resist, is emitted from the irradiating means prior to the periphery exposing operation. Then, the operation of the moving means is controlled, the moving means relatively moving the light beam emitted from the irradiating means and the substrate in the radial direction of rotation of the substrate while rotating the substrate in such a manner that the periphery portion of the substrate is irradiated with the second light beam by a predetermined width (hereinafter the above-described operation is simply called a "dummy tracking operation"). During the dummy tracking operation, information about the change in the relative movement position of the moving means during at least one rotation of the substrate and the rotational angular position of the substrate are made to correspond to each other before they are memorized. Then, the first light beam which can be sensed by the resist is emitted from the irradiating means so as to expose the periphery portion of the substrate while controlling the operation of the moving means in accordance with the information memorized previously. Furthermore, a calibration operation is performed by using a light shielding member prior to the dummy tracking operation so as to obtain a reference signal (aiming value) for the servo control. By using the thus-obtained reference signal, the dummy tracking operation is performed. Therefore, even if the exposing light source is deteriorated, exchanged or the exposing light beams are not uniformly distributed in terms of their intensities, the dummy tracking operation can be accurately performed after the intensity and the intensity distribution of the exposing light beam, irradiated toward the peripheral portion of the wafer immediately before the irradiation, have been estimated. Consequently, the exposure width of the overall peripheral portion including the cut portion (OF) and as well as claw portions to be described later can be accurately controlled.

Other and further objects, features and advantages of the invention will be appear more fully from the following description.

DESCRIPTION OF THE PREFERRED EMBODIMENTS

Figure 1:
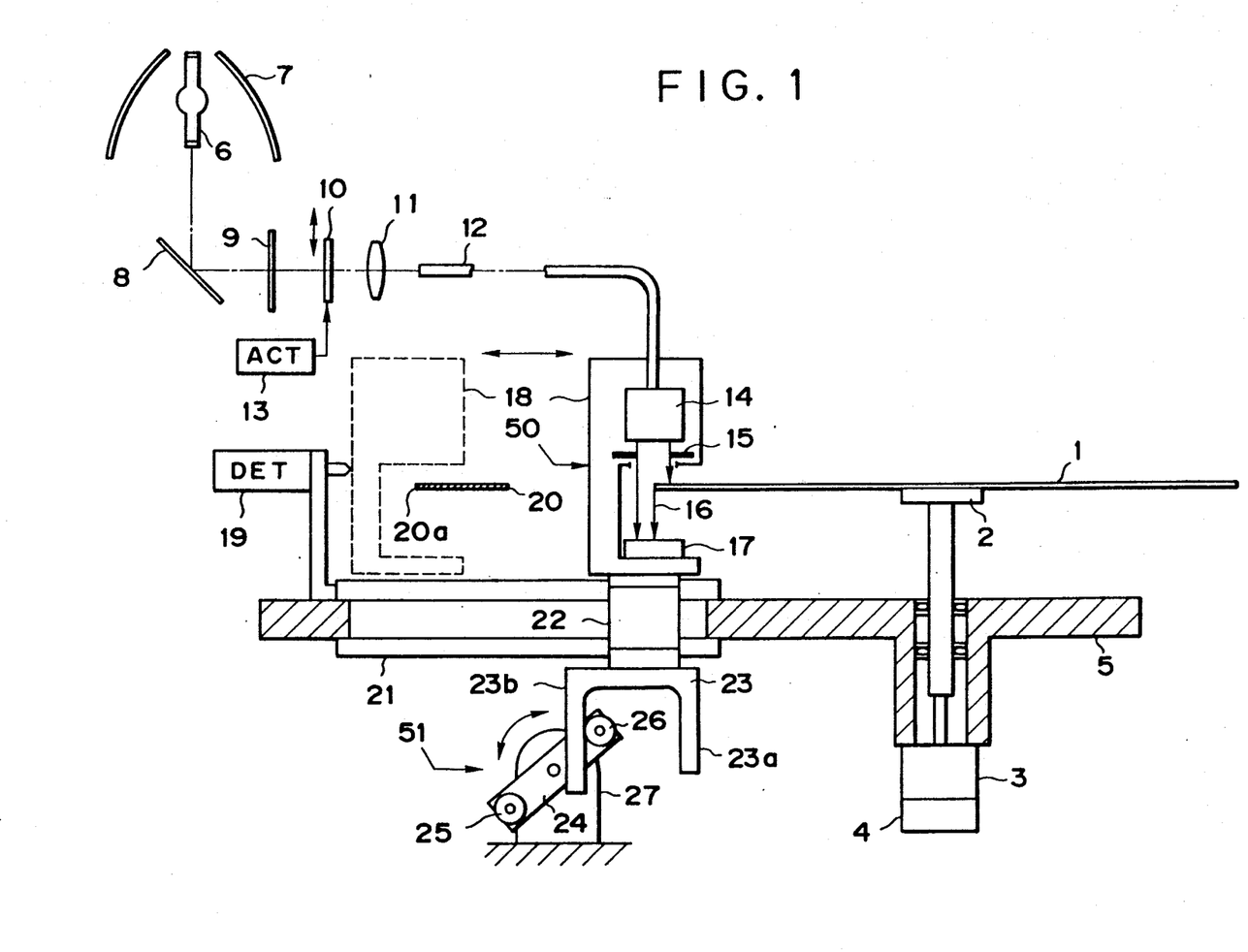
FIG. 1 illustrates the schematic structure of an embodiment of a periphery exposing apparatus according to the present invention.

FIG. 1 illustrates the schematic structure of an embodiment of a periphery exposing apparatus according to the present invention. Referring to FIG. 1, a turn table 2 is pivotally disposed on a base 5 so that a wafer 1, which has been conveyed to positioned above the turn table 2 through a wafer conveyance path (omitted from illustration) is received by the turn table at a position at which the center of the wafer 1 coincides (where it must not accurately coincide but a certain eccentricity is permitted) with the rotational center of the turn table 2. As a result, the wafer 1 is sucked and held at that position. The turn table 2 is rotated by a motor 3 secured to the lower portion of the base 5 at a predetermined speed. The motor 3 has an encoder 4 for detecting the amount of rotation of the turn table 2.

A light source 6 (extra-high pressure mercury lamp) emits irradiating light having a predetermined spectral distribution (spectral characteristics), the irradiating light being then converged by a lens 11 at an end surface on the incidence side of the optical fiber 12 after it has encountered an elliptic mirror 7, a mirror 8, a shutter 9 (for example, a rotary shutter having four blades) and a wavelength selective filter 10. Then, the irradiating light is introduced into an irradiating portion 14 disposed above the peripheral portion of the wafer 1, the irradiating light being introduced as described above through the optical fiber 12. Since the shutter 9 acts to open/close the irradiating optical path, it may be omitted from the structure in a case where a laser apparatus is employed as the light source in such a manner that the light source is turned on/off.

The wavelength selective filter 10 cuts irradiating light in a predetermined wavelength range, the wavelength selective filter 10 being constituted in such a manner that it can be introduced/retracted to and from the irradiating optical path by a drive portion 13. According to this embodiment, when the filter 10 is placed in the optical path, the filter 10 cuts the irradiating light (the first light beam according to the present invention and is simply called "exposing light" hereinafter) of the irradiating light emitted from the light source 6 in the wavelength range which is sensed by to the resist to be formed on the surface of the wafer 1. Therefore, the residual irradiating light except for the exposing light, that is, the irradiating light (the second light beam according to the present invention and is simply called "non-exposing light" hereinafter) in a wavelength range (in a long wavelength range) which is not sensed by the resist is always emitted from the irradiating portion 14 regardless of a fact whether or not the filter 10 is present. As described above, this embodiment is arranged in such a manner that the filter 10 is introduced/retracted to and from the optical path so that the peripheral portion of the wafer 1 is selectively irradiated with only non-exposing light when the filter 10 is placed in the optical path and the same is irradiated with, as an irradiating light beam 16, all of irradiating light (including exposing light) emitted from the light source 6 when the filter 10 is retracted from the optical path. The elements given the reference numerals starting from the light source 6 to the lens 11 may be disposed in an allowable space in place of the positions adjacent to the irradiating portion 14.

The irradiating portion 14 has a diaphragm 15 for restricting the shape of the irradiating light beam 16 transmitted from the light source 6 through the optical fiber 12. Furthermore, the light receiving portion 17 comprising a position sensor, a silicon photodiode and the like is disposed to substantially confront the irradiating portion 14 via the held peripheral portion of the wafer 1. As a result, when the outer edge of the wafer 1 or a light shielding plate 20 to be described later has shielded a portion of the irradiating light beam 16, the light receiving portion 17 receives the residual light beams. In response to a photoelectric signal transmitted from the light receiving portion 17, the wafer 1 or the edge (a reference edge portion 20a) of the light shielding plate 20 is detected. The irradiating portion 14 and the light receiving portion 17 are integrally secured to a housing 18, the housing 18 being secured to a movable block 23 via a slider 22. The irradiating portion 14, the light receiving portion 17 and the housing 18 (to be collectively called an "exposing unit 50" hereinafter) are enabled by a drive mechanism 51 (to be described later) comprising a movable block 23, a motor 27 and the like to move along a linear guide 21 in the lateral direction of the drawing sheet attached to this specification, that is, in the radial direction (in the radial direction extended from the rotation center of the turn table 2) of the wafer 1. Although omitted from the illustration, the motor 27 comprises means (an encoder 38 to be described later) for detecting the amount of movement of the exposing unit 50.

The light shielding plate (dummy wafer) 20 for use in a calibration operation to be described later is, at substantially the same height as that of the wafer 1, fastened in a range in which the exposing unit 50 can be moved in order to shield a portion of the irradiating light beam 16 emitted from the irradiating portion 14 when the exposing unit 50 has been moved to a position away from the peripheral portion of the wafer 1. Furthermore, the light shielding plate 20 has the reference edge portion 20a for shielding a portion of the irradiating light beam 16, the reference edge portion 20a being disposed substantially parallel to the peripheral portion of the wafer 1. In order to detect the position of the exposure unit 50 after it has moved, a position detector 19 comprising an encoder, a position scale, an interferometer and the like is disposed on the base 5. The position detector 19 may have either a length-measurement range capable of covering the overall movement stroke of the exposing unit 50 or a length-measurement range limited to the portions in the vicinity of the position at which the light shielding plate 20 is irradiated with the irradiating light beam 16.

Figure 2:
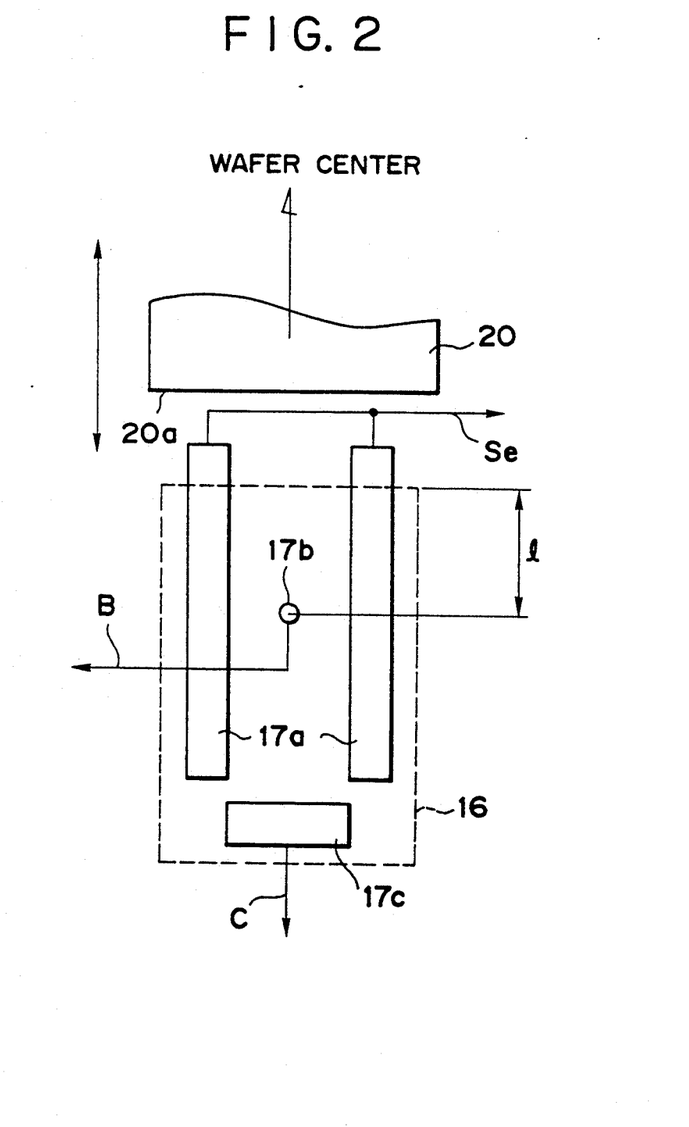
FIG. 2 illustrates the schematic structure of a light receiving portion of the periphery exposing apparatus according to the embodiment of the present invention.

The structure of the light receiving portion 17 and the positional relationship between the irradiating light beam 16 and the light shielding plate 20 will now be described with reference to FIG. 2. The light receiving portion 17 comprises a light receiving element 17a having two slit-like elongated light receiving surfaces extending in the direction in which the exposing unit 50 moves, an edge sensor 17b in the form of a pinhole and a light receiving element 17c disposed farthest from the light shielding plate 20. The light receiving element 17a outputs photoelectric signal Se, formed by adding, by an amplifier (omitted from illustration), two photoelectric signals respectively transmitted from the two slit sensors, Se which corresponds to the luminous intensity (quantity of light) of the irradiating light beam 16 which has reached the light receiving portion 17 because it has not been shielded by the light shielding plate 20 or the wafer 1. The light receiving element 17c always outputs photoelectric signal C the level of which corresponds to the luminous intensity of the irradiating light beam 16. On the other hand, the edge sensor 17b detects the fixed point, that is, the reference edge portion 20a of the light shielding plate 20 or the edge of the wafer 1, the edge sensor 17b outputting photoelectric signal B the level of which is large when the edge 20a is positioned in a range of l from the front end portion (adjacent to the wafer) of the irradiating light beam 16 and the level of which is substantially zero when the edge 20a is positioned at a distance exceeding l.

The light receiving portion 17 is, as illustrated, irradiated with the irradiating light beam 16 so that the positional relationship between the light receiving portion 17 and the irradiating light beam 16 is not changed. That is, the distance I from the front portion of the irradiating light beam 16 to the edge sensor 17b is previously determined. Therefore, it is arranged in such a manner that the exposure width on the light shielding plate 20 or the wafer 1 is l at a position at which the light shielding plate 20 or the wafer 1 is placed in the irradiating light beam and it shields the light beam to be received by the edge sensor 17b. In a case where the exposure width is set to arbitrary value L, the exposure unit 50 is moved while causing the position detector 19 to perform the position detecting operation by only a quantity which corresponds to the value of $(L-l)$ while making the position (distance l) of the edge sensor 17b to be a standard. As a result, the irradiating light beam 16 is irradiated in such a manner that the exposure width on the light shielding plate 20 is the arbitrary value L. Then, the signal Se obtained by the light shielding portion 17 at this time is, as a reference signal for the servo operation, stored in a memory 31 (to be described later). The above-described structure is necessary to perform the calibration operation to be described later.

The drive mechanism for driving the exposure unit 50 will now be described with reference to FIGS. 3A to 3E. As shown in FIG. 1, a roller 25 and a roller 26 are secured to the two end portions of a rotational arm 24. The rotational arm 24 is reciprocatively rotated by a motor 27 while making substantially the midpoint of the rotational shaft of the roller 25 and that of the roller 26 to be the rotational axis. At least two contact members 23a and 23b, which are perpendicularly suspended, are formed at the two end portions in the direction in which the movable block 23 moves. The movable block 23 (that is, the slider 22) rectlinearly moves along the linear guide 21 while being pressed to the roller 25 or the roller 26 by a spring (omitted from illustration) for example, a tension spring. According to this embodiment, the distance (the distance between the centers of the two rotational shafts) from the roller 25 to the roller 26 and the distance (the distance between the two contact surfaces) between the two contact members 23a and 23b are made to be substantially the same. A moving means according to the present invention is constituted by the elements given the reference numerals starting from the movable block 23 to the motor 27, the moving means being hereinafter simply called a "drive mechanism" 51.

Figure 3A:
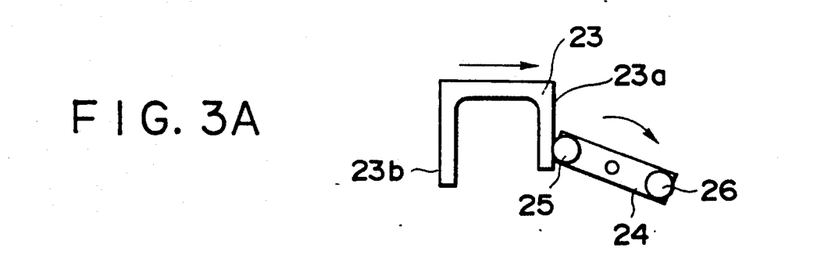
FIGS. 3A to 3E illustrate a drive mechanism for the periphery exposing apparatus according to the embodiment of the present invention.
Figure 3B:
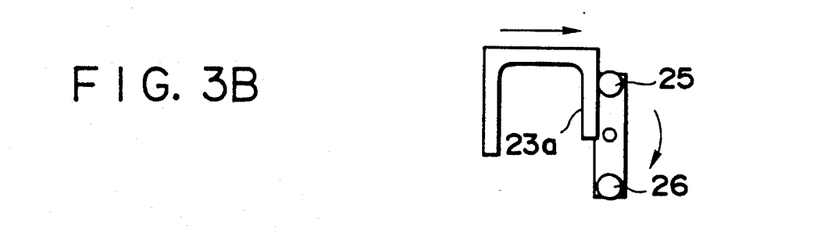
Figure 3C:
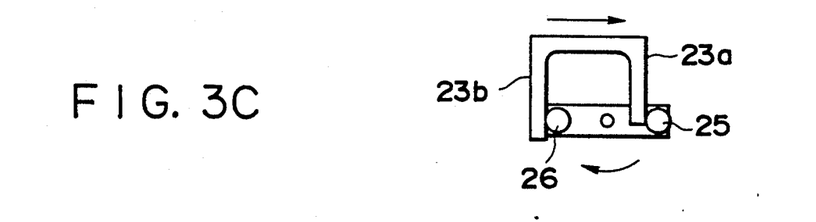
Figure 3D:
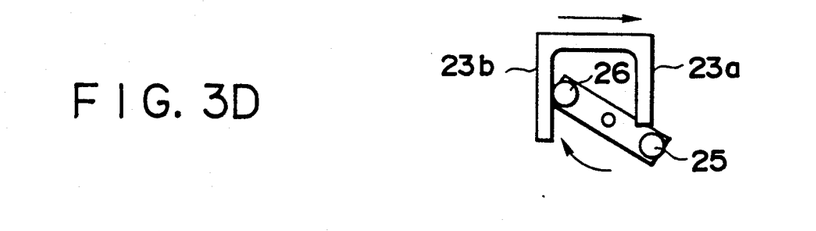
Figure 3E:
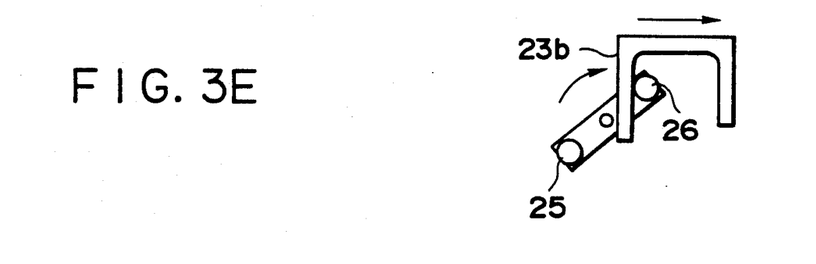

In the apparatus thus-constituted, when the motor 27 is rotated in a state shown in FIG. 3A and thereby the arm 24 is rotated clockwise, the movable block 23 is gradually rectilinealy moved to the right when viewed in the drawing in such a manner that its contact member 23a is pressed to the roller 25 by the spring force. As a result, a state as shown in FIG. 3B is realized. When the arm 24 is rotated by about 90° from the state shown in FIG. 3B, the roller 26 commences to abut against the contact member 23b as shown in FIG. 3C. Simultaneously, the roller 25 is separated from the contact member 23a. When the rotational arm 24 further rotates, the rectilinear movement of the movable block 23 to the right is continued in a state where the contact member 23b is pressed to the roller 26 by the spring force. The cam mechanism thus-constituted will cause a drive apparatus capable of moving by a large quantity to be obtained although its space is significantly reduced.

Figure 4:
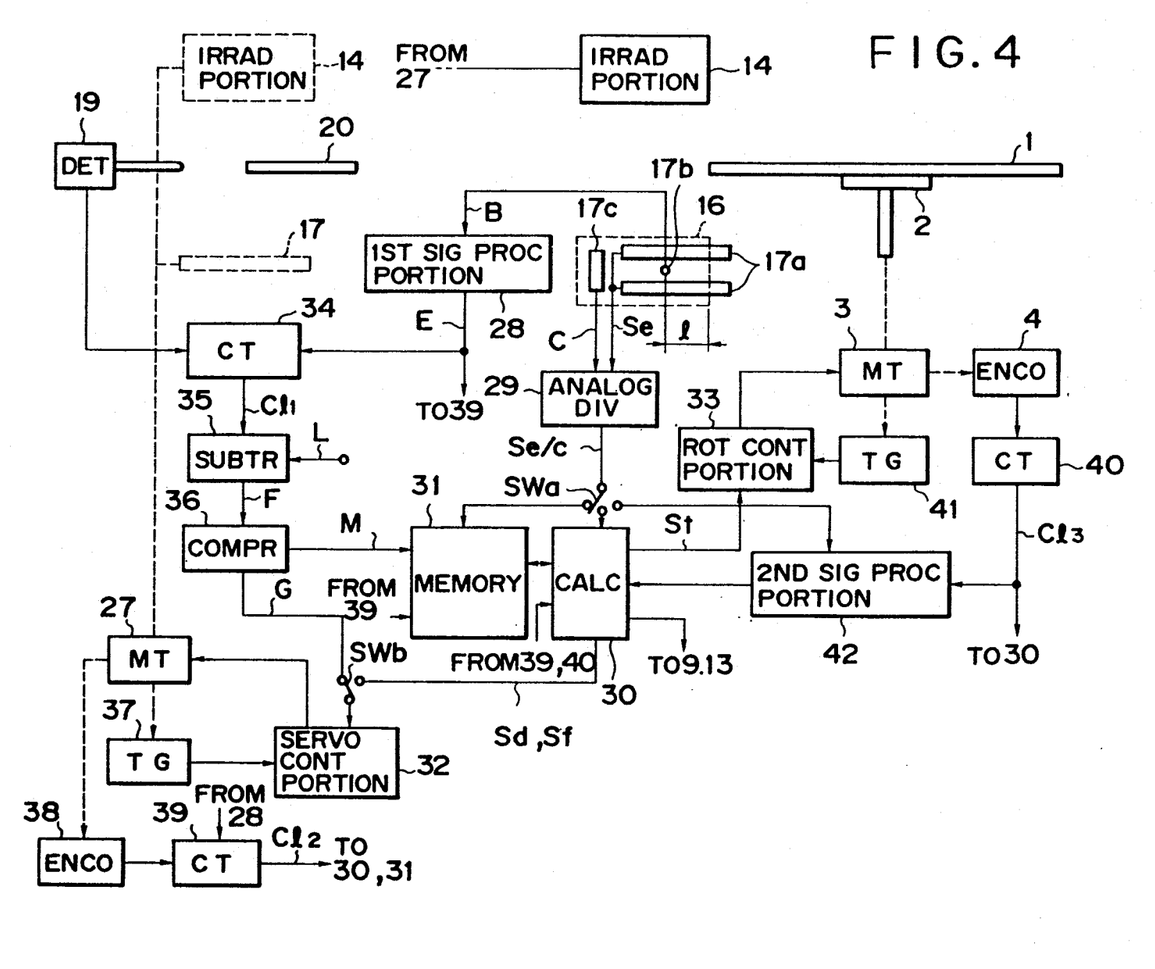
FIG. 4 is a block diagram which illustrates the overall structure of a control system of the periphery exposing apparatus according to the embodiment of the present invention.

FIG. 4 is a block diagram which illustrates the overall structure of the control system of this embodiment of the periphery exposing apparatus according to the present invention. Referring to FIG. 4, a first signal processing portion 28 receives the photoelectric signal B detected by the edge sensor 17b and outputs binary edge-detection signal E, the logical value of which is inverted when the reference edge portion 20a (or the wafer edge) of the light shielding plate 20 crosses the portion above the edge sensor 17b, to a counter 34 of the position detector 19 and a counter 39 of the encoder 38 included in the drive mechanism 51 (the motor 27) of the exposing unit 50. The counter 34 counts the number of the position signals (pulses) transmitted from the position detector 19 and presets the count to a value, which corresponds to reference exposure width l, at the moment at which the logical value of the edge detection signal E is transmitted from the first signal processing portion 28. Furthermore, count $Cl_1$ denoting the actual exposure width and transmitted from the counter 34 is, together with information L about an arbitrarily set exposure width (required exposure width in the peripheral portion), supplied to a subtracter 35. As a result, the subtracter 35 calculates difference F between the two information items L and $Cl_1$ so as to output the result of the calculation to a comparator 36. The comparator 36 determines whether or not F is zero. If it has been determined that the difference F is zero, memory control signal M is transmitted to the memory 31, the memory control signal M causing the memory 31 to memorize the detection signal Se transmitted from the light receiving portion 17 as a servo control reference signal for use at the time of exposing the peripheral portion. If a determination has been made that the above-described difference F is not zero, the comparator 36 transmits rotation signal G, which causes the difference F to be reduced, to a servo control portion 32 via a switch SWb.

As described above, the light receiving portion 17 is arranged in such a manner that its light receiving element 17a receives the light beam of the irradiating light beam 16 emitted from the irradiating portion 14 which is not shielded by the light shielding plate 20 or the wafer 1 and thereby passed. Furthermore, the detection signal Se, the level of which corresponds to the quantity of the received light beam, is transmitted to an analog divider 29. Also the photoelectric signal C transmitted from the light receiving element 17c is supplied to the divider 29 so that the detection signal Se is divider by the photoelectric signal C. A signal Se/C transmitted from the divider 29 is properly switched over by a switch SWa so as to be transmitted to the memory 31 at the time of the calibration operation to be described later, to a calculating portion 30 at the time of dummy-tracking (to be described later) the wafer edge and to a second signal processing portion 42 at the time of detecting the OF of the wafer 1. The second signal processing portion 42 detects the OF of the wafer 1 and also receives information about the angle of rotation (count $Cl_3$ made by a counter 40 to be described later) transmitted from the encoder 4 so as to detect the change in the position of the wafer edge at each unit rotational angle (for example, 0.5°) of the turn table 2. Therefore, the second signal processing portion 42 includes an A/D converter and a memory, the A/D converter acting to digitally sample the waveform of a signal transmitted from the divider 29 in response to up/down pulses supplied from the encoder 4.

The calibration operation is performed in such a manner that the memory 31 receives the signal Se/C transmitted from the divider 29 so as to memorize the signal Se/C at the moment at which it receives the above-described memory control signal M transmitted from the comparator 36. Furthermore, the memory 31 transmits the above-described signal Se/C as the servo reference signal to the calculating portion 30 at the dummy tracking operation. The calculating portion 30 receives the signal Se/C transmitted from the light receiving portion 17 via the analog divider 29 and the switch SWa so as to calculate deviation signal Sd between the above-described two signals and transmit the deviation signal Sd to the servo control portion 32. The servo control portion 32 receives, from the calculating portion 30 via the switch SWb, the deviation signal Sd denoting the level difference between the level (the voltage level) of aiming signal Se/C memorized as the reference signal and the level of the actual signal Se/C transmitted from the light receiving portion 17. Then, the servo control portion 32 transmits a servo drive signal to the motor 27. The motor 27 receives, via the switch SWb, the servo drive signal at the time of the dummy tracking operation, while it receives the control signal G transmitted from the comparator 36 at the time of the calibration operation, so that it moves the exposure unit 50. A tachogenerator 37 feeds back a signal, which corresponds to the rotational speed of the motor 27, to the servo control portion 32 so that the exposure unit 50 can be always moved at controlled speed. At this time, the position of the exposure unit 50 is detected by measuring the quantity of rotation of the motor 27 by the encoder 38 and the counter 39 so that count $Cl_2$ corresponding to the detected position is transmitted to both the calculating portion 30 and the memory 31. The counter 39 counts the number of the position signals (pulses) transmitted from the encoder 38 and, similarly to the above-described counter 34, presets the count to a value, which corresponds to reference exposure width l, at the moment at which the logical value of the edge detection signal E is transmitted from the first signal processing portion 28.

The calculating portion 30 receives data about the proper exposure quantity for the resist to be used and registered in the memory 31 so as to determine the exposing conditions (the luminous intensity of exposing light and the like) and the rotational speed of the turn table 2 so as to prevent bubbles which will be generated due to the irradiation of the irradiating light beam (exposing light beam). A rotation control portion 33 for rotating the wafer 1 receives signal St denoting the rotational speed transmitted from the calculating portion 30 so as to rotate the motor 3, whereby the turn table 1 is rotated at predetermined speed. The tachogenerator 41 feeds back a signal, which corresponds to the rotational speed of the motor 3, to the rotation control portion 33. As a result, the turn table 2 can be always rotated at control speed. The rotational angle position (the quantity of rotation) of the turn table 2 is, by the encoder 4 and the counter 40, always detected at a resolution of, for example, about 0.5°. Furthermore, count $Cl_3$, which corresponds to its rotational angle position, is transmitted to the calculating portion 30 and the second signal processing portion 42. At this time, the counter 40 counts the number of the position signals (pulses) transmitted from the encoder 4 and presets the count to a value which corresponds to the position of the OF at the moment when the OF is detected by, according to this embodiment, the second signal processing portion 42.

In order to cause the peripheral portion of the wafer 1 to be irradiated with the irradiating light beam 16 by an arbitrary exposure width L, the servo control portion 32 moves the exposure unit 50 in response to the deviation signal Sd transmitted from the calculating portion 30. That is, during the dummy tracking operation, the memory 31 receives the counts $Cl_2$ and $Cl_3$ (however, the count $Cl_3$ is received via the calculating portion 30) transmitted from the corresponding counters 39 and 40 so as to memorize the count $Cl_2$ made by the counter 39 for each unit quantity of rotation (for example, 0.5°) of the turn table 2 in accordance with the sequential order of the address (each rotational angle position of the wafer 1). At the time of the periphery exposing operation, the calculating portion 30 receives, together with the count $Cl_2$ made by the counter 39, the above-described information supplied from the memory 31. The calculating portion 30 supplies signal Sf denoting the deviation between the above-described two information items to the servo control portion 32. The servo control portion 32 moves the exposure unit 50 by the motor 27 in such a manner that the above-described signal Sf is substantially zero so that the exposure width in the peripheral portion of the wafer 1 made by the irradiating light beam 16 is controlled to the predetermined value L. The calculating portion 30 issues predetermined drive commands to a shutter drive portion (omitted from illustration) and the filter drive portion 13, respectively. As a result, closing/opening of the irradiating optical path by the action of the shutter 9 and the insertion/retraction of the filter 10 are controlled. The two switches SWa and SWb shown in FIG. 4 are illustrated in their states at the time of the calibration operation. The two switches SWa and SWb are switched over at the dummy tracking operation and the periphery exposing operation.

Figure 5:
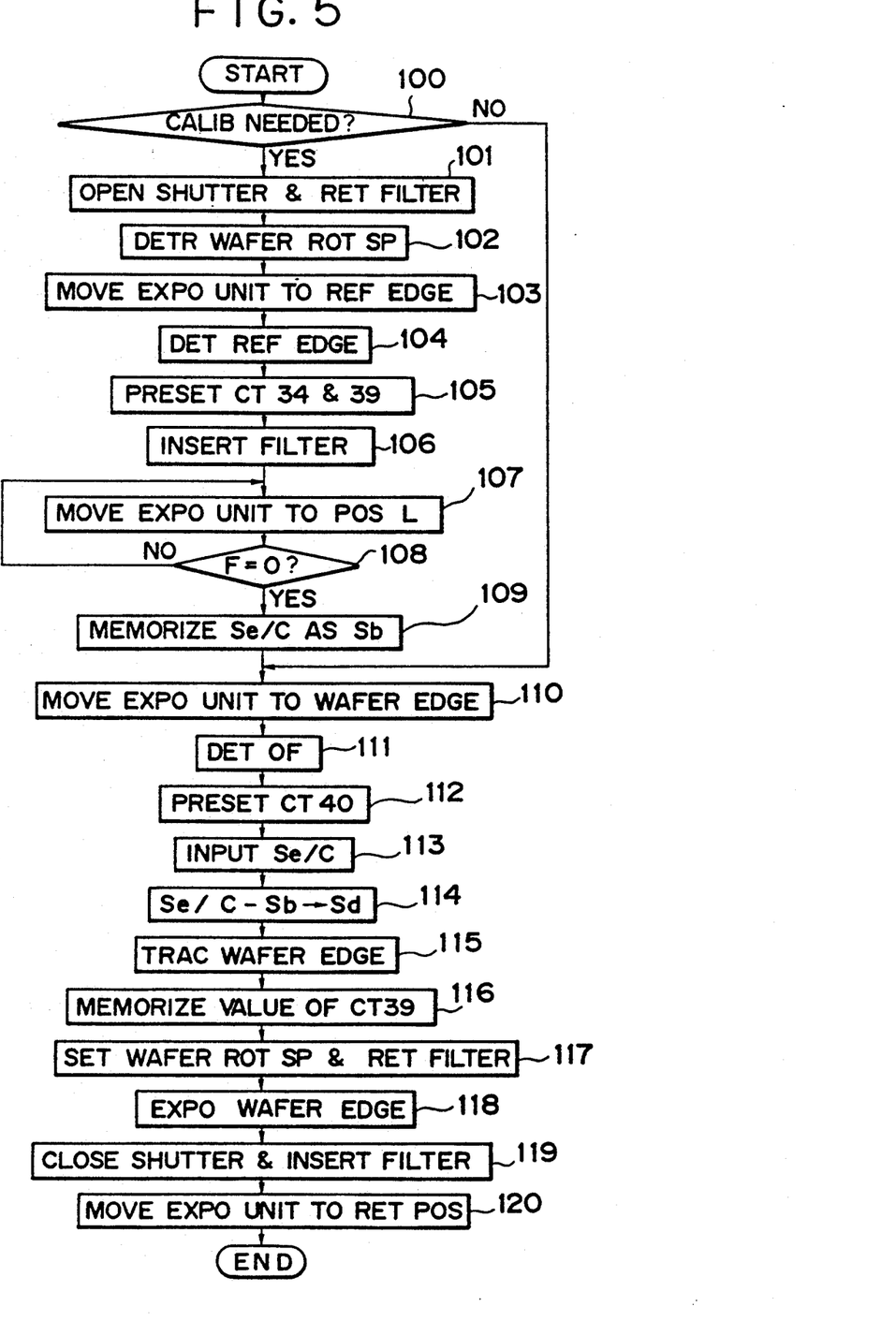
FIG. 5 is a flow chart which illustrates an example of the operation of the periphery exposing apparatus according to the embodiment of the present invention.
Figure 6:
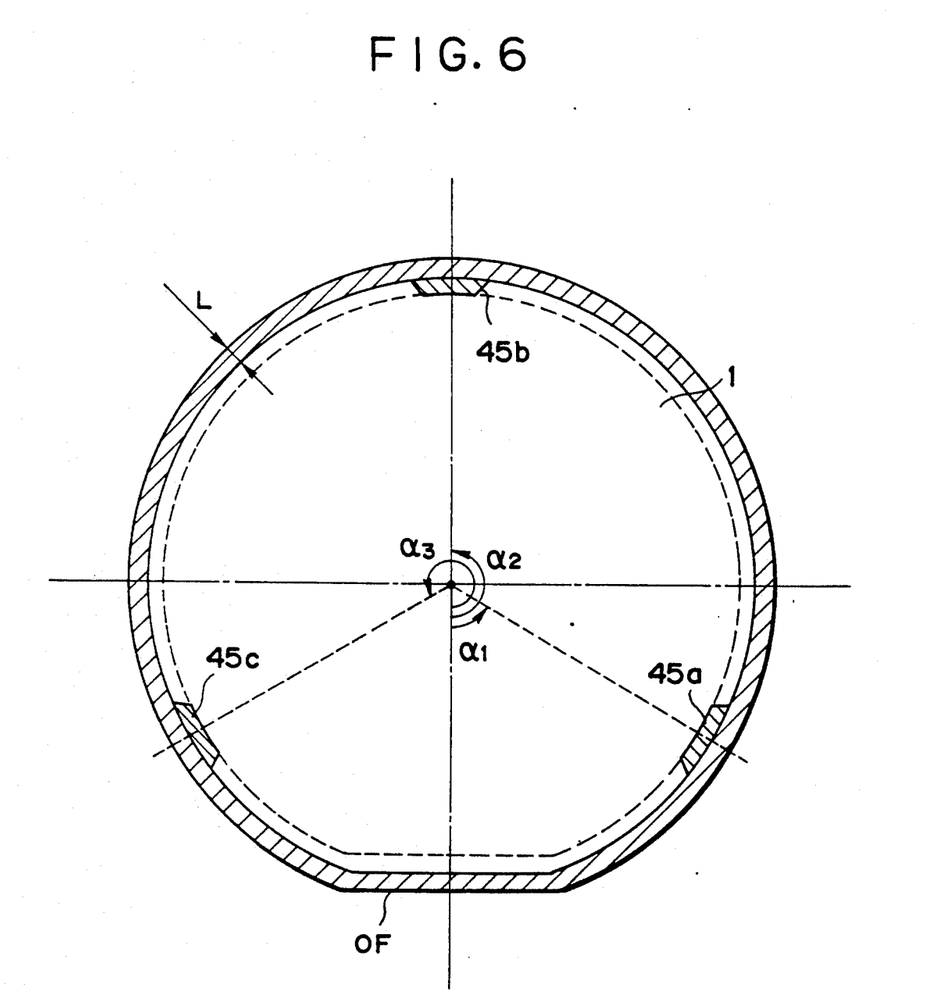
FIG. 6 illustrates the state of a substrate which has been subjected to the periphery exposure including the claw portion.

The operation of the periphery exposing apparatus according to this embodiment will now be described with reference to FIG. 5. When the wafer is supplied/received to and from a conveying arm, which is able to move along a wafer conveyance path (omitted from illustration), that is, a guide, and the turn table, the exposing unit 50 is moved to a predetermined retraction position. Therefore, the calibration operation is performed at the above-described retraction position according to this embodiment. As a result, the calibration operation can be performed at any time during the injection/discharge of the wafer. Furthermore, the undesirably deterioration in the throughput due to the calibration operation can be prevented. An assumption is made here that the exposing unit 50 has been moved to the retraction position in order to hold the first wafer on the turn table 2. Furthermore, there are provided a processing device (etching device and the like) for use in a process next to the pattern exposure process and a plurality of holding claws for pressing the wafer to a wafer holder depending upon the type of the exposing apparatus. Since the resist in a region with which the above-described claws come in contact is not exposed to light, the portion including the region (hereinafter simply called a "claw portion") with which the above-described claws come in contact must be subjected to the peripheral exposing process. If the peripheral portion of the wafer is exposed by the exposure width (designated by a short dashes line of FIG. 6) which corresponds to the width (the radial directional length of the wafer) of the claw portion, the area of the exposing region on the wafer will be reduced, causing the yield to be deteriorated. Therefore, it is preferable that only the claw portion be exposed to light while including the peripheral portion. Accordingly, this embodiment is arranged in such a manner that the portions including the above-described claw portion are subjected to the periphery exposing operation performed in such a manner that, for example, regions (the peripheral portion of the set exposure width L and the claw portions 45a to 45c) designated by diagonal line portions are subjected to the periphery exposing process. The positions of the claw portions 45a to 45c are determined, as shown in FIG. 6, by rotational angles $\alpha_1$ to $\alpha_3$ (fixed values on the apparatus) while making the central point of the OF or an arbitrary point (where it is set to central point Q of the OF) to be the standard.

Prior to the commencement of exposing the peripheral portion of the wafer 1, the calibration operation is performed for the purpose of obtaining the reference signal for the servo operation at the time of the dummy tracking operation at the retraction position of the exposing unit 50. First, the calculating portion 30 determines whether or not the calibration has been completed under predetermined exposing conditions (the intensity of irradiating light, the set exposure width and the like) (step 100). If the calibration has been completed, the flow proceeds to step 110. Although the calibration operation may be performed for each wafer as described above, it is performed for each lot (about 25 wafers accommodated) of the sequential wafers to be exposed and subjected to the same process or whenever a sensor for monitoring the fluctuation of the light emission point of the light source 6 detects the change so far as the above-described conditions, that is, the set exposure width is not changed. On the other hand, if the calibration has not been completed, the flow proceeds to next step 101 in which the shutter 9 is opened to cause the irradiating portion 14 to emit the irradiating light beam 16. Furthermore, the wavelength selective filter 10 is retracted from the irradiating optical path. As a result, the light receiving portion 17 is, via the irradiating portion 14, irradiated with irradiating light (including exposing light) in all of the wavelength regions generated by the light source 6 without being shielded by the light shielding plate 20. Then, the calculating portion 30 calculates information St about the rotational speed of the wafer 1 (step 102) in accordance with the quantity of exposure (that is, the signal C transmitted from the light receiving element 17c) detected by the light receiving portion 17 and the aiming quantity of exposure (the proper quantity of exposure for the resist to be used).

Then, the drive mechanism 51 finely moves the exposing unit 50 to the reference edge portion 20a of the light shielding plate 20 (step 103). Then, the reference edge portion 20a of the light shielding plate 20 is introduced into the irradiating light beam until it reaches the edge sensor 17b of the light receiving portion 17. At this time, the first signal processing portion 28 outputs the edge detection signal E to the counters 34 and 39 (step 104) As a result, the counts $Cl_1$ and $Cl_2$ made by the counters 34 and 39 are preset to the reference exposure width l (designed value)(step 105). Then, the calculating portion 30 inserts the filter 10 into the optical path via the drive portion 13 (step 106).

In a case where the exposure width L for the peripheral portion set at the time of starting the apparatus and the reference value l are different from each other, the exposing unit 50 is moved to a position at which the count $Cl_1$ of the counter 34 is the same as the set exposure width L while monitoring by using the position detector 19 (step 107). In accordance with the difference F between the count $Cl_1$ of the counter 34 and the set exposure width L obtained by the subtracter 35, that is, $L - Cl_1$, the comparator 36 determines whether or not the above-described difference F is zero (step 108). If a determination is made that F=0, the comparator 36 stops the rotation of the motor 27 and transmits the memory control signal M to the memory 31. If a determination is made that F is not zero, operations in steps 107 and 108 are repeated and the servo control portion 32 continuously moves the exposing unit 50 until F=0 in response to the signal G transmitted from the comparator 36. At the moment when the memory 31 receives the memory control signal M, it memorizes, as the reference signal Sb, the signal Se/C transmitted from the divider 29, that is, a signal formed by standardizing the signal Se transmitted from the light receiving element 17a by the intensity value (the signal C transmitted from the light receiving element 17c) of the irradiating light beam (non-exposing light beam) transmitted from the irradiating portion 14 in a state where the filter is inserted (step 109). Thus, the calibration is completed. Although the wafer is taken from a loader cassette and is held on the turn table 2 during the above-described operation, no positioning operation is performed here. Therefore, the direction of the OF is made arbitrary.

Figure 7A:
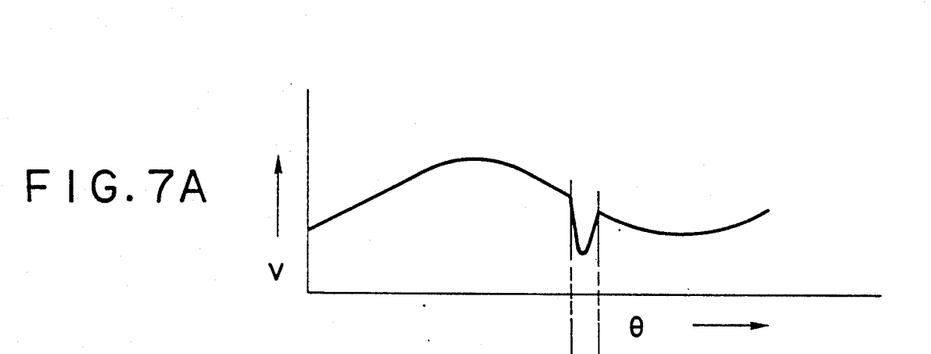
FIGS. 7A and 7B illustrate the operation for detecting the OF performed by the periphery exposing apparatus according to the embodiment of the present invention.
Figure 7B:
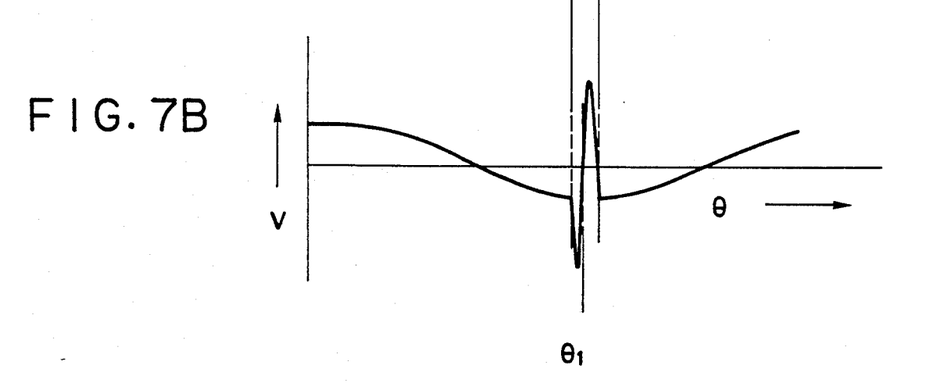

Then, the calculating portion 30 moves the exposing unit 50 from the retraction position to the peripheral portion of the wafer 1, while detecting the position by using the encoder 38, in accordance with the previously-memorized schematic distance (designed value) between the reference edge portion 20a of the light shielding plate 20 and the outer portion (wafer edge) of the wafer 1 (step 110). Then, in order to determine the positions (rotational angles) of the claw portions 45a to 45c standardizing the OF (the central point Q), the OF of the wafer 1 is detected. First, the turn table 2 is rotated so that the irradiating light beam 16, which has not been shielded by the wafer 1, is photoelectrically detected by the light receiving portion 17. At this time, the signal Se/C transmitted from the divider 29 is, via the switch Swa, supplied to the second signal processing portion 42. The second signal processing portion 42 then samples the above-described signal Se/C in response to the up/down pulses supplied from the encoder 4 before it converts each of the sampled values into digital values so as to be memorized in a memory (omitted from illustration) in accordance with the sequential order of the addresses. As a result, signal waveform data as shown in FIG. 7A and corresponding to the profile of the wafer edge can be obtained in the memory of the second signal processing portion 42. FIG. 7A illustrates the relationship between the level (voltage) V of the photoelectric signal and the rotational angle $\theta$, that is, the change in the position of the wafer edge from the rotational center of the turn table 2. The second signal processing portion 42 performs a software-like differentiating operation so as to convert the waveform data shown in FIG. 7A into waveform data shown in FIG. 7B. Referring to FIG. 7B, the zero-cross point (differentiation value) is the rotational angle which corresponds to the central point Q of the OF. The second signal processing portion 42 calculates the rotational angular value $\theta_1$ of the zero-cross point present between the maximum value (peak value) and the minimum value (bottom value) of the waveform from the waveform data stored in the memory (step 111). The calculating portion 30 presets the count made by counter 40 and corresponding to the above-described rotational angular value $\theta_1$ to a predetermined value (step 112). The above-described presetting may be performed at the moment at which the count, which correspond to the above-described rotational angle $\theta_1$, is obtained from the counter 40 after the OF, which had passed through the irradiating light beam 16, has been again introduced into the irradiating light beam. As a result, the count made by the counter 40 and the positions of the claw portions 45a to 45c standardizing the central point Q are made to correspond to each other.

Then, the dummy tracking of the wafer edge is performed in accordance with the above-described calibration. The dummy tracking operation is immediately commenced after the operation in step 112 has been performed simultaneously with the presetting of the count made by the counter 40. First, the light beam of the light beams 16 emitted from the irradiating portion 14 which has not been shielded by the wafer 1 is photoelectrically detected by the light receiving portion 17 in a state where the filter is inserted. The calculating portion 30, via the switch SWa, receives the signal Se/C processed by the divider 29 (step 113). Furthermore, the calculating portion 30 makes a comparison between the reference signal Sb obtained in step 109 and the signal Se/C supplied from the divider 29 so that the deviation is obtained (step 114). Then, the calculating portion 30 transmits the signal Sd, which corresponds to the deviation thus-obtained, to the servo control portion 32 via the switch SWb. The servo control portion 32 supplies the servo signal to the motor 27 in such a manner that the deviation signal Sd supplied from the calculating portion 30 is made to be zero so as to servo-control the exposing unit 50 (step 115). As a result, a region of a predetermined distance from the edge of the wafer 1 in the radial direction is uniformly irradiated with the irradiating light beam 16 by substantially a predetermined width (designed value L). At this time, the exposing unit 50 is servo-controlled in the claw portions 45a to 45c in accordance with the count made by the counter 40, which has been preset in step 112, the exposing unit 50 being servo-controlled in accordance with its width (radial directional length) and the positions (angles $\alpha_1$ to $\alpha_3$). As a result, the peripheral portion including the claw portions are subjected to the dummy tracking in step 115. It is preferable that the width of the claw portion be, similarly to the set exposure width L, subjected to the calibration. In this state, the exposing unit 50 is servo-controlled in the claw portions 45a to 45c in such a manner that the deviation signal denoting the result (which corresponds to the reference signal Sb) of the calibration is made to be zero.

The memory 31 memorizes the count made by the counter 39 for a period in which the wafer 1 rotates at least one time, the count being memorized in such a manner that it correspond to the rotational angular position of the wafer 1. That is, the memory 31 memorizes the count made by the counter 39 in accordance with its sequential order of the addresses in synchronization with the up/down pulses generated by the encoder 4 when the turn table 2 rotates by a unit quantity of rotation. Then, the calculating portion 30 transmits the speed information St of the wafer 1 obtained in step 102 to the rotation control portion 33. The rotation control portion 33 controls the motor 3 in accordance with the above-described information St so that the turn table 2 is rotated at predetermined speed. Simultaneously, the filter 10 is retracted from the optical path by means of the drive portion 13 so that the peripheral portion of the wafer is irradiated with both the non-exposing light beam and the exposing light beam through the irradiating portion 14 (step 117). Since the tachogenerator 41 is connected to the motor 3, the rotational speed is fed back to the rotational control portion 33 and the turn table 2 is thereby always rotated at predetermined speed.

Then, the calculating portion 30 reads from the memory 31 information memorized in step 116 for each rotational angular position of the turn table 2 in accordance with the count $Cl_3$ made by the counter 40. The calculating portion 30 transmits the signal Sf, which corresponds to the deviation between the above-described information (the count made by the counter 39) and the count actually output from the counter 39, to the servo control portion 32. The servo control portion 32 supplies the above-described signal Sf to the motor 27 in such a manner that the above-described signal Sf is made to be substantially zero. As a result, the exposing unit 50 is servo-controlled (step 118). Therefore, the irradiating light beam 16 and the wafer 1 are relatively translated in the radial direction so that the exposure width of the peripheral portion including the claw portions made by the irradiating light beam 16 is always made to be a desired set value. As a result, a precise periphery exposure is performed. After the wafer 1 has rotated by a predetermined quantity (at least one rotation), the irradiating optical path is shut by the shutter 9 simultaneously with the insertion of the filter 10. As a result, the exposure of the peripheral portion of one wafer is completed (step 119). Then, the exposing unit 50 is moved to the retraction position and the wafer 1 is released from the vacuum sucking by the turn table 2 before it is conveyed by the conveying arm (step 120).

According to this embodiment of the present invention, the irradiation of the irradiating light beam 16 from the irradiating portion 14 is continued during the movement of the exposing unit 50 in a state where the filter 10 is being inserted into the optical path. Another structure may be employed in which the shutter 9 is opened/closed before or after the calibration, the OF detection, the dummy tracking and the periphery exposing operations and the irradiating light beam 16 is emitted from the irradiating portion 14 in only the period of the above-described operations. In addition, according to this embodiment, the periphery exposure (step 118) is commenced after the filter 10 has been retracted from the optical path. However, the timing of the commencement of the periphery exposure may be adjusted by the opening/shutting operation of the shutter 9.

Furthermore, a structure may be employed in which the rotational speed of the wafer 1 is set to the speed obtained in step 102 at only the periphery exposing operation (step 118). The rotational speed may be raised at the time of the other operations such as the OF detection (step 111) or the dummy tracking (step 115) operation in consideration of the throughput. Although the diaphragm 15 is, according to this embodiment, disposed between the irradiating portion 14 and the wafer 1, another structure may be employed in which the light emitting end of the optical fiber 12 is formed into, for example, a rectangular shape and the light emitting end is disposed extremely adjacently to the surface of the wafer 1. In a case where the apparatus thus-constituted is disposed in the stepper, for example, in the wafer conveying portion, a portion of the irradiating light generated in the light source for the stepper may be introduced into the above-described apparatus through an optical fiber or the like. In this case, an advantage can be obtained in that the light source 6 can be omitted from the structure.

The count made by the counter 39 for at least one rotation of the wafer 1 memorized in step 116 denotes information about the positional change (that is, the shape of the wafer) of the wafer edge. Therefore, if data (count) about the shape of the wafer 1, in particular, if data about the boundary between the OF portion and the circumferential portion or that about the claw portion encounters a disorder, the above-described data may be subjected to a compensation such as smoothing. If the periphery exposing is performed by using the compensation data, the control accuracy of the exposure width can be improved. In addition, when the exposing unit 50 is servo-controlled at the time of the dummy tracking, the outputs (voltage levels) from the two slit sensors (light receiving element 17a) may be individually detected and the exposing unit 50 may be servo-controlled in such a manner that the two outputs or the difference between the two outputs is always made to be a constant value. In this case, the dummy tracking accuracy can be improved, causing the set exposure width L to be further accurately controlled. In addition, the OF can be accurately detected in step 111 while satisfactorily following the rotational speed of the turn table 2.

According to this embodiment, although the wafer edge including the claw portions is subjected to the dummy tracking in step 115, it is apparent that necessity of performing the OF detection and the presetting of the counter (steps 111 and 112) can be eliminated in a case where no claw portion is provided. Therefore, the operation in step 113 is performed immediately after the operation in step 110 has been completed. The second signal processing portion 42 can, of course, be omitted from the structure in this case. Furthermore, if the portions including the claw portion is not subjected to the dummy tracking in step 115 as in the above-described embodiment, the necessity of performing the OF detection (step 111) prior to the dummy tracking operation can be eliminated. In this case, the claw portion is bypassed in step 115 and only the peripheral portion (set value L) is subjected to the dummy tracking. Then, the count made by the counter 39 is memorized in step 116 and as well as the OF position is detected from the count (information about the shape of the wafer) thus memorized. In step 118, the portion including the claw portions are subjected to the periphery exposure similarly to the above-described embodiment and standardizing the position of the OF thus obtained. Therefore, the necessity of providing the second signal processing portion 42 can be eliminated and the operations in steps 111 and 112 can be omitted. Consequently, an advantage can be obtained in that the processing time can be shortened.

According to this embodiment, the position detector 19 (linear scale) is used at the time of the calibration operation, and the necessity of using the encoder 38 can be eliminated if the position detector 19 is able to measure the range which is able to cover the overall movable stroke of the exposing unit 50. Therefore, the count $Cl_1$ made by the counter 34 can be used in all of the operations according to the above-described embodiment. Furthermore, according to this embodiment, the light shielding plate 20 is provided for the purpose of performing the calibration. However, a wafer to be subjected to the periphery exposure may be used in place of the light shielding plate. Since the OF faces an arbitrary direction as described above, the OF must be detected (step 111) prior to the calibration. In addition, since the position of the exposing unit 50 must be measured in the calibration operation, it is preferable that the position detector 19 exhibiting a wide measurement range be used in place of the encoder 38.

In a case where no information about the distance between the reference edge portion of the light shielding plate 20 and the designed outer portion (edge) of the wafer 1 is memorized in the servo control portion 32, the exposing unit 50 is moved in a direction toward the periphery portion of the wafer 1 while making the irradiating portion 14 emit the irradiating light beam 16. In this case, the calculating portion 30 detects the edge of the wafer 1 in accordance with the change in the level of the detection signal Se, and the exposing unit 50 is, similarly to the above-described embodiment, servo controlled while rotating the motor 27 in accordance with the deviation signal Sd emitted from the calculating portion in the ensuing dummy tracking operation. Furthermore, although this embodiment is arranged in such a manner that the OF is detected by using the exposing unit 50, an individual device for detecting the OF may be provided.

According to this embodiment of the present invention, the periphery portion of a circular substrate such as a wafer having an OF is exposed to light. However, the present invention can, of course, be applied to a case in which the periphery portion of a circular substrate having a notch (V-shape cut portion) or that of a polygonal substrate is exposed.

As described above, according to the present invention, the structure is constituted in such a manner that the dummy tracking is performed prior to the periphery exposure. Furthermore, information about the change in the relative position of the movement by means of the moving means for relatively moving the irradiating light beam and the substrate in the radial direction of the rotation and the rotational angular position of the substrate are memorized while making them correspond to each other. Furthermore, the operation of the moving means is controlled in accordance with the information thus-memorized at the time of the periphery exposure. In addition, the calibration operation is performed by using the light shielding member prior to the dummy tracking operation, and the reference signal for controlling the servo operation obtained in the calibration operation is used to perform the dummy tracking operation. Therefore, even if the exposing light source is deteriorated or exchanged or the luminous intensity distribution of the exposing light beam is not uniform, the dummy tracking operation can be accurately performed while estimating the intensity of the irradiating light beam to be irradiated toward the periphery portion of the wafer immediately before the irradiation and the intensity distribution. Therefore, the exposure width in the overall region of the periphery portion including the cut portion (OF) and the claw portions can be accurately controlled. Furthermore, tracking position information at the time of the dummy tracking is memorized by a quantity for one rotation. Therefore, even if the tracking servo encounters a failure, the main exposure can be performed while modifying the memorized data or the main exposure can be stopped in a case where the modification cannot be performed. As a result, the total yield can be improved in comparison to the case where the tracking is performed by the exposing light beam from the operation start.

Although the invention has been described in its preferred form with a certain degree of particularly, it is understood that the present disclosure of the preferred form can be changed in the details of construction, and the combination and re-arrangement parts may be resorted to without departing from the spirit and the scope of the invention as hereinafter claimed.

What is claimed is:

1. An exposing apparatus for exposing the periphery portion of a substrate on which photoresist is uniformly applied while rotating said substrate by rotating means around a substantially central portion of said substrate, said exposing apparatus comprising:

irradiating means capable of radiating a light beam, which is not sensed by said photoresist, toward the periphery portion of said substrate;

light receiving means disposed to confront said irradiating means, receiving said light beam and outputting a light receipt signal in accordance with the quantity of received light, said substrate being disposed between said irradiating means and said light receiving means so as to shield a portion of said light beam;

detection means for detecting the rotational angle of said substrate and outputting an angular signal;

moving means for relatively moving said light beam irradiated and said substrate in a radial direction; and control means for controlling said moving means in accordance with said light receipt signal and said angular signal, 2. An exposing apparatus for exposing the periphery portion of a substrate on which photoresist is uniformly applied while rotating said substrate by rotating means around a substantially central portion of said substrate, said exposing apparatus comprising:

- irradiating means capable of radiating either one of a first light beam, which is sensed by said photoresist, and a second light beam, which is not sensed by said photoresist, toward the periphery portion of said substrate;
- light receiving means disposed to confront said irradiating means, receiving the radiated light beam and outputting a light receipt signal in accordance with the quantity of received light, said substrate being disposed between said irradiating means and said light receiving means so as to shield a portion of the radiated light beam;
- detection means for detecting the rotational angle of said substrate and outputting an angular signal;
- moving means for relatively moving the radiated light beam and said substrate in a radial direction;
- determining mean for determining the quantity of a relative movement between said second light beam and said substrate, which is necessary to make the radial directional width of a region of said peripheral portion of said substrate which is irradiated with said second light beam to be uniform, in accordance with said light receipt signal when said second light beam is radiated by said irradiating means and said substrate is rotated;
- memorizing means for memorizing said quantity of said relative movement in such a manner that it is made to correspond to said angular signal; and
- control means for controlling said moving means in accordance with said quantity of said relative movement and said angular signal memorized by said memorizing means when said first light beam is radiated by said irradiating means and said substrate is rotated so as to relatively move said first light beam and said substrate.

3. An exposing apparatus according to claim 2, wherein
said control means has movement quantity detection means for detecting the quantity of said relative movement between said first light beam and said substrate and a servo mechanism for determining the difference between an actual relative movement quantity between said first light beam and said substrate detected by said movement quantity detection means and a relative movement quantity memorized by said memorizing means by making a comparison between them and driving said moving means in accordance with said difference.

4. An exposing apparatus according to claim 2 further comprising:
calibration means having a light shielding member, said calibration means preliminarily determining the relationship between the quantity of light received by said light receiving means when said light shielding member is interposed between said irradiating means and said light receiving means and the position of said light shielding member, wherein said moving means is controlled in accordance with said relationship.

5. An exposing apparatus according to claim 2, wherein said irradiating means comprises an irradiating member and a filter member capable of filtering light emitted from said irradiating member, wherein said filter member filters said emitted light so that said second light beam is radiated and said filter member does not filter said emitted light so that said first light beam is radiated.

6. An exposure apparatus according to claim 1, wherein said control means controls said moving means so that the radiated light beam and said substrate are relatively moved in such a manner that the radial directional width of a region which is irradiated is substantially constant in said periphery portion of said substrate.

* * * * *